(12) United States Patent
Kobayashi et al.

(10) Patent No.: US 7,875,981 B2
(45) Date of Patent: Jan. 25, 2011

(54) INSULATING FILM MATERIAL, MULTILAYER INTERCONNECTION STRUCTURE, METHOD FOR MANUFACTURING SAME, AND METHOD FOR MANUFACTURING SEMICONDUCTOR DEVICE

(75) Inventors: Yasushi Kobayashi, Kawasaki (JP); Yoshihiro Nakata, Kawasaki (JP); Shirou Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 528 days.

(21) Appl. No.: 12/037,439

(22) Filed: Feb. 26, 2008

(65) Prior Publication Data
US 2008/0203574 A1   Aug. 28, 2008

(30) Foreign Application Priority Data
Feb. 26, 2007 (JP) .............................. 2007-045762

(51) Int. Cl.
*H01L 23/485* (2006.01)
(52) U.S. Cl. .............................. 257/759; 257/E23.141; 257/E21.495; 438/623; 556/434; 556/433
(58) Field of Classification Search ................. 257/759, 257/E23.141, E21.495; 438/623; 556/434, 556/433
See application file for complete search history.

(56) References Cited

U.S. PATENT DOCUMENTS 4,801,507 A * 1/1989 Estes et al. ............... 428/450

(Continued)

FOREIGN PATENT DOCUMENTS

JP    1-313528 A    12/1989

(Continued)

OTHER PUBLICATIONS

European Office Action, issued Mar. 17, 2010 for corresponding European Patent Application No. 08100966.4.

(Continued)

*Primary Examiner*—Marcos D. Pizarro
*Assistant Examiner*—Eva Yan Montalvo
(74) *Attorney, Agent, or Firm*—Westerman, Hattori, Daniels & Adrian, LLP

(57) ABSTRACT

To provide an insulating film material that can be advantageously used for forming an insulating film having a low dielectric constant and excellent resistance to damage, such as etching resistance and resistance to liquid reagents, a multilayer interconnection structure in which a parasitic capacitance between the interconnections can be reduced, efficient methods for manufacturing the multilayer interconnection structure, and an efficient method for manufacturing a semiconductor device with a high speed and reliability. The insulating film material contains at least a silicon compound having a steric structure represented by Structural Formula (1) below.

Structural Formula (1)

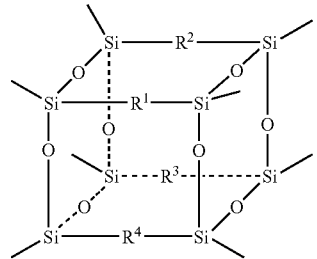

where, $R^1$, $R^2$, $R^3$, and $R^4$ may be the same or different and at least one of them represents a functional group containing any of a hydrocarbon and an unsaturated hydrocarbon.

15 Claims, 8 Drawing Sheets

U.S. PATENT DOCUMENTS

| | | |
|---|---|---|
| 2004/0152296 A1* | 8/2004 | Matz et al. .................. 438/623 |
| 2006/0122351 A1 | 6/2006 | Laine et al. |
| 2006/0204680 A1 | 9/2006 | Hattori et al. |
| 2007/0026689 A1 | 2/2007 | Nakata et al. |

FOREIGN PATENT DOCUMENTS

| | | |
|---|---|---|
| JP | 5-051458 A | 3/1993 |
| JP | 2000-290287 A | 10/2000 |
| JP | 2004-303777 A | 10/2004 |
| JP | 2006-319114 A | 11/2006 |

OTHER PUBLICATIONS

European Search Report dated Jul. 6, 2009, issued in corresponding European Patent Application No. 08100966.4.

Japanese Office Action dated May 26, 2009, issued in corresponding Japanese Patent Application No. 2007-045762.

Laine, R. M. et al.; "Organic/Inorganic Molecular Hybrid Materials from Cubic Silsesquioxanes"; Organic/Inorganic Hybrid Materials II., Apr. 5, 1999, pp. 3-14, vol. 576, San Francisco, CA, XP000897883.

Lichtenhan, J. D. et al.; "Nanostructured Chemicals: A New Era in Chemical Technology"; 32nd International Sample Technical Conference, Nov. 5-9, 2000, pp. 185-191, vol. 32, XP009040986.

* cited by examiner

INSULATING FILM MATERIAL, MULTILAYER INTERCONNECTION STRUCTURE, METHOD FOR MANUFACTURING SAME, AND METHOD FOR MANUFACTURING SEMICONDUCTOR DEVICE

CROSS-REFERENCE TO RELATED APPLICATIONS

This application is based upon and claims the benefits of the priority from the prior Japanese Patent Application No. 2007-045762 filed on Feb. 26, 2007, the entire contents of which are incorporated herein by reference.

BACKGROUND OF THE INVENTION

1. Field of the Invention

The present invention relates to an insulating film material that can be advantageously used for forming an insulating film within a multilayer interconnection structure in a semiconductor integrated circuit, a multilayer interconnection structure having an insulating film that is formed using the insulating film material and that has a low dielectric constant and excels in resistance to damage, a method for manufacturing the multilayer interconnection structure, and a method for manufacturing a semiconductor device.

2. Description of the Related Art

A demand for multilayer semiconductor elements has recently increased following the increase in the degree of integration of semiconductor integrated circuits and the rise of element density. Because spacing between interconnections further decreases as the degree of integration of semiconductor integrated circuits grows, interconnection delay caused by the increase in capacitance between the interconnections becomes a problem. Here, the interconnection delay (T) is represented by the following formula: $T \propto CR$ and is, therefore, affected by an interconnection resistance (R) and a capacitance (C) between interconnections. The relationship between a dielectric constant ($\in$) and the capacitance (C) between interconnections is represented by the following formula: $C = \in_0 \in_r \cdot S/d$, where S is an electrode surface area of an electrode, $\in_0$ is a dielectric constant of vacuum, $\in_r$ is a dielectric constant of an insulating film, and d is a distance between interconnections. Although the capacitance (C) between interconnections can be decreased by reducing the interconnection thickness and decreasing the electrode surface area, the decrease in interconnection thickness causes additional increase in interconnection resistance (R), thereby making it impossible to attain a high speed. Therefore, decreasing the dielectric constant of the insulating film is an effective means for reducing the interconnection delay (T) and increasing speed.

There is a trend to decrease a spacing between metal interconnections in semiconductor devices having a multilayer interconnection structure. Accordingly, the impedance of metal interconnection determined by electrostatic inductance increases, and the increase in delay of response speed and power consumption causes concerns. Therefore, it is necessary to reduce the specific permittivity of interlayer insulating film provided between a semiconductor substrate and a metal interconnection or between metal interconnections as much as possible.

Inorganic materials such as silicon dioxide ($SiO_2$), silicon nitride (SiN), and phosphosilicate glass (PSG), and organic polymer materials such as polyimides have been used as conventional materials for insulating films.

However, a dielectric constant of $CVD-SiO_2$ films that are widely used in semiconductor devices is as high as about 4. Further, a SiOF film that has been studied as a CVD film with a low dielectric constant has a dielectric constant of about 3.3 to 3.5, but it has high hygroscopicity and the dielectric constant thereof increases with time.

It has recently been suggested to add an organic resin or the like that is evaporated or decomposed on heating to a material for forming a film with a low dielectric constant and to obtain a porous film in which pores are formed by heating during deposition. Because porous films have pores, a dielectric constant lower than that in the conventional configurations can be realized, but the problem that is presently associated with this approach is that the pore size is as large as 10 nm or more and where a porosity (pore presence ratio) is increased with the object of further decreasing the dielectric constant, moisture absorption causes increase in dielectric constant and decrease in film strength.

Further, a material for forming a porous insulating film containing an organopolysiloxane having a specific cage structure (see Japanese Patent Application Laid-Open (JP-A) No. 2004-303777) and a film-forming material containing an organosilicon compound having a cage-like polyhedron structure (see JP-A No. 2000-290287) have also been disclosed.

However, at present, multilayer interconnection structures and semiconductor devices are manufactured by processing the films with a low dielectric constant by etching that employs plasma and liquid reagents, and the problem associated with such technique is that dielectric constant increases due to damage to the film with a low dielectric constant. In the films formed using the materials described in JP-A Nos. 2004-303777 and 2000-290287, because the Si—O—Si bonds are broken during etching, resistance to damage, such as etching resistance and resistance to liquid reagents, deteriorates, the effective permittivity increases after etching, and the response speed of semiconductor device decreases.

BRIEF SUMMARY OF THE INVENTION

The insulating film material of one aspect of an embodiment includes a silicon compound having a steric structure represented by Structural Formula (1) below:

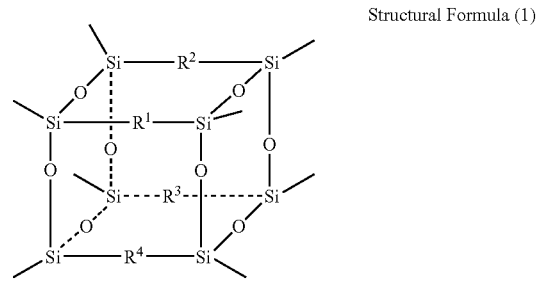

Structural Formula (1)

where, $R^1$, $R^2$, $R^3$, and $R^4$ may be the same or different and at least one of $R^1$, $R^2$, $R^3$, and $R^4$ represents a functional group comprising any of a hydrocarbon and an unsaturated hydrocarbon.

The insulating film material contains a silicon compound having a steric structure represented by the Structural Formula (1), and in this steric structure, bonds of silicon atoms and carbon atoms (Si—R—Si bonds, where R is a functional group represented by the $R^1$ to $R^4$ above) are regularly bonded via oxygen atoms. As a result, voids are formed in the skeleton of the steric structure and a dielectric constant is decreased. Further, because rigid Si—R—Si bonds are contained, the degree of freedom of the bonds is small, and an insulating film formed using the insulating film material has a high strength and excels in resistance to damage, such as etching resistance and resistance to liquid reagents. Therefore, the insulating film material can be advantageously used for forming an insulating film and a multilayer interconnection structure, can be advantageously used for manufacturing semiconductor devices of various kinds and can be especially advantageously used for manufacturing the multilayer interconnection structure of an aspect of an embodiment.

A signal propagation speed has been known to be decreased by a parasitic capacitance of insulating films, but in the generation of semiconductor devices with an interconnection spacing of 1 µm or more, the effect of the interconnection delay on the entire device is small. The degree of integration of semiconductor integrated circuits has recently increased and a transition was made to multilayer interconnection structures which resulted in decreased interconnection width and spacing. Thus, where a circuit is formed with an interconnection spacing of 1 µm or less, and especially 0.1 µm or less, as will be in the future circuits, the parasitic capacitance between interconnections produces a significant effect on the device speed.

Presently, a multilayer interconnection structure of a semiconductor device is composed of a coating-type insulating film with a low dielectric constant, an etching stopper film formed by plasma CVD, and a diffusion barrier insulating film, but the coating-type insulating film with a low dielectric constant is most often produced as a porous film to meet the requirement relating to the decrease in dielectric constant, and such film is easily damaged by processing during multilayer interconnection structure formation. Therefore, the resistance to damage has to be increased. Further, at present, multilayer interconnection structures and semiconductor devices are manufactured by processing the film with a low dielectric constant by plasma, electron beam, liquid reagents, and the like, and each of these methods can cause an increase in dielectric constant due to damage of the film with a low dielectric constant. However, the insulating film formed from the insulating film material of an aspect of an embodiment has a low dielectric constant, excels in damage resistance, and can contribute to the increase in response speed. Therefore, the decrease in parasitic capacitance between the interconnections can be attained and the signal propagation speed can be increased.

The multilayer interconnection structure of an aspect of an embodiment includes at least interconnection layers and an interlayer insulating film, wherein the interlayer insulating film is formed using the insulating film material of an aspect of an embodiment.

Because the multilayer interconnection structure has an interlayer insulating film that is formed using the insulating film material of an aspect of an embodiment, has a lower dielectric constant and reduced parasitic capacitance and also excels in resistance to damage, the signal propagation speed can be increased. Such a multilayer interconnection structure is especially suitable, for example, to semiconductor integrated circuits with a high degree of integration such as IC and LSI that require increase in the response speed.

The method of an aspect of an embodiment for manufacturing a multilayer interconnection structure is a method for manufacturing the multilayer interconnection of an aspect of an embodiment and includes at least the steps of: forming an insulating film by using the insulating film material of an aspect of an embodiment on a surface to be processed; forming an interconnection pattern by etching the insulating film; and forming an interconnection by using the interconnection pattern.

In the method for manufacturing a multilayer interconnection structure, the insulating film is formed on the surface to be processed in the step of forming an insulating film by using the insulating film material of an aspect of an embodiment. In the step of forming an interconnection pattern, an interconnection pattern is formed by etching the insulating film. In the step of forming an interconnection, the interconnection is formed using the interconnection pattern. The multilayer interconnection structure of t an aspect of an embodiment is efficiency formed by repeatedly performing a sequence of steps including the step of forming an insulating film, the step of forming an interconnection pattern, and the step of forming an interconnection.

The method for manufacturing a semiconductor device of an aspect of an embodiment includes at least a step of forming a multilayer interconnection structure on a surface to be processed by using the method for manufacturing the multilayer interconnection structure of an aspect of an embodiment.

In the method for manufacturing a semiconductor device, a multilayer interconnection structure is formed on the surface to be processed by the method for manufacturing the multilayer interconnection of an aspect of an embodiment in the step of forming a multilayer interconnection. As a result, the parasitic capacitance between the interconnections can be reduced and interconnection resistance can be decreased, and a high-performance semiconductor device that enables the increase in signal propagation speed can be efficiently manufactured. Such a semiconductor device is especially suitable for flash memories, DRAMs, FRAMs, and MOS transistors.

DETAILED DESCRIPTION OF THE INVENTION

Insulating Film Material

Figure 1A:
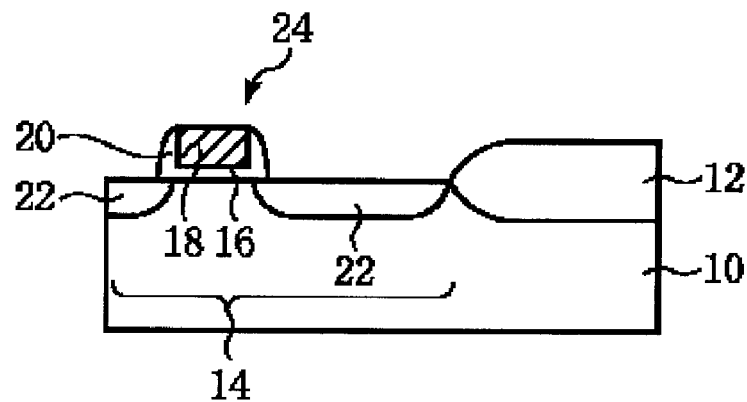
FIG. 1A is a process diagram (first) illustrating one example of methods for manufacturing a multilayer interconnection structure and a semiconductor device that have an insulating film formed by using the insulating film material.

The insulating film material contains at least a silicon compound having a steric structure represented by Structural Formula (1) below and, if necessary, contains a solvent and other components.

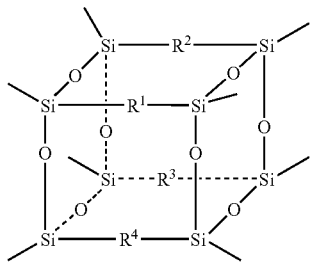

Structural Formula (1)

In the Structural Formula (1), $R^1$, $R^2$, $R^3$, and $R^4$ may be the same or different and at least one of them represents a functional group containing any of a hydrocarbon and an unsaturated hydrocarbon.

—Silicon Compound—

No specific limitation is placed on the silicon compound, provided that it has a steric structure represented by the Structural Formula (1) above as a unit structure, and the silicon compound can be selected appropriately according to the object. The entire structure may be any steric structure, for example, a rectangular parallelepiped, a cube, a triangular column, a triangular pyramid, a quadrangular pyramid, a sphere, a polyhedron, and a regular polygon, but a symmetric structure is preferred.

The steric structure represented by the Structural Formula (1) has symmetry and contains cavities of a large size in the skeleton. Therefore, the dielectric constant is reduced. Yet another advantage thereof is that because the degree of freedom of the bonds is small and the cavities are arranged uniformly, the strength of the insulating film fabricated using the insulating film material containing the silicon compound is increased even when the presence ratio of the cavities is increased.

No specific limitation is placed on a method for confirming the presence of the steric structure represented by the Structural Formula (1) in the silicon compound, and this method can be selected appropriately according to the object. For example, the analysis can be conducted by measuring absorption peaks by infrared spectroscopy (IR).

$R^1$, $R^2$, $R^3$, and $R^4$ in the Structural Formula (1), may be the same or different, no specific limitation is placed thereon, provided that at least one of them represents a functional group containing any of a hydrocarbon and an unsaturated hydrocarbon, and they can be selected appropriately according to the object. From the standpoint of demonstrating damage resistance performance with respect to etching that cuts the siloxane network, the preferred groups include an alkylene group, an alkenylene group, an alkynylene group, a cycloalkylene group, an arylene group, an aralkylene group, a carbonyl group, a heterocyclic group, an alkylydene group, a hydrocarbylene group, and a hydrocarbylidene group that are optionally substituted. In the case of substituted groups, groups substituted with a hetero atom are preferred, suitable examples thereof including heteroalkylene groups, heteroalkenylene groups, heteroalkynylene groups, and heteroarylene groups. Among them, specific example of preferred groups include methylene group, ethylene group, propylene group, butylene group, ethyne group, ethynylene group, vinylene group, benzylene group, phenylene group, and naphthylene groups, with methylene group, ethylene group, propylene group and butylene group being even more preferred.

No specific limitation is placed on the weight-average molecular weight of the silicon compound and it can be selected appropriately according to the object, but it is preferably 200 to 50,000, more preferably 300 to 10,000.

Where the weight-average molecular weight is less than 200, when the insulating film is formed by coating, it evaporates if dissolved in the solvent, and a film is sometimes difficult to form. Where the weight-average molecular weight is more than 50,000, the silicon compound sometimes cannot be dissolved in the solvent.

No specific limitation is placed on the method for measuring the weight-average molecular weight and the method can be selected appropriately according to the object. For example, the weight-average molecular weight can be measured by gel permeation chromatography (GPC).

No specific limitation is placed on the content of the silicon compound having a steric structure represented by the Structural Formula (1) in the insulating film material and the content can be selected appropriately according to the object. Preferably this content is 1.0% by mass to 50% by mass, more preferably 5.0% by mass to 30% by mass.

Where the content is less than 1.0% by mass, the insulating film obtained has poor damage resistance and is sometimes damaged by etching with plasma or a liquid reagent. Where the content exceeds 50% by mass, the strength of the insulating film decreases and the film is sometimes cannot be applied to a multilayer interconnection structure.

—Solvent—

No specific limitation is placed on the solvent, provided that it can dissolve the silicon compound, and the solvent can be selected appropriately according to the object. Examples of suitable solvents include water, methanol, ethanol, propanol, cyclohexanone, methyl isobutyl ketone, methyl ethyl ketone, methyl cellosolve, ethyl cellosolve, octane, decane, propylene glycol, propylene glycol monomethyl ether acetate, diethylene glycol, propylene glycol monomethyl ether, propylene glycol monoethyl ether, and propylene glycol monopropyl ether. These solvent may be used singly or in combination.

The content of the solvent in the insulating film material can be determined appropriately according to the type or content of the silicon compound.

—Other Components—

No specific limitation is placed on the aforementioned other components, provided that they do not affect adversely the effect of the present invention, and these components can be selected appropriately according to the object. For example, well-known additives of various kinds can be used.

The content of the other components in the insulating film material can be determined appropriately according to the type or content of the silicon compound and the solvent.

Because the insulating film material comprises the silicon compound having the steric structure represented by the Structural Formula (1), an insulating film that has a low dielectric constant and excels in resistance to damage, such as etching resistance and resistance to liquid reagents, can be formed, and such insulating film can be advantageously used in the manufacture of the below-described multilayer interconnection structure and semiconductor device.

(Multilayer Interconnection Structure)

The multilayer interconnection structure comprises at least interconnection layers and an interlayer insulating film. If necessary, the multilayer interconnection structure can also include other members (layers or films) that are selected appropriately.

—Interconnection Layer—

No specific limitation is placed on the material, shape, structure, thickness, and the like of the interconnection layer and they can be selected appropriately according to the object. From the standpoint of increasing the degree of circuit integration, a laminated structure (multilayer structure) is preferred as the structure.

—Interlayer Insulating Film—

The interlayer insulating film is formed using the insulating film material.

No specific limitation is placed on the method for forming the interlayer insulating film, and this method can be selected appropriately according to the object. For example, the interlayer insulating film can be formed by coating the insulating film material on the surface to be processed.

No specific limitation is placed on the surface to be processed and it can be selected appropriately according to the object. For example, when the insulating film is used in a semiconductor device, the surface of a semiconductor substrate or the like, more specifically the surface of a substrate such as a silicon wafer, or the surface of oxidation films of various types serve as the surface to be processed.

No specific limitation is placed on the coating method and it can be selected appropriately according to the object. Examples of suitable methods include spin coating, dip coating, kneader coating, curtain coating, and blade coating method. Among these methods, spin coating is preferred because of good coating efficiency thereof. When spin coating is employed, the conditions thereof include, for example, a rotation speed of about 100 rpm to 10,000 rpm, preferably 800 rpm to 5,000 rpm, and a time of about 1 sec to 10 min, preferably 10 sec to 90 sec.

The C/O atomic ratio in the interlayer insulating film measured by X ray photoelectron spectroscopy is preferably 0.2 to 5.0.

Where the C/O atomic ratio is less than 0.2, the resistance of the film to damage deteriorates, and the interlayer insulating film can be damaged by etching with plasma or a reagent. Where the ratio is more than 5.0, the presence ratio of functional groups of hydrocarbons or unsaturated hydrocarbons in the steric structure represented by the Structural Formula (1) of the silicon compound increases and the steric structure represented by the Structural Formula (1) is sometimes difficult to fabricate.

The C/O atomic ratio can be easily adjusted by mixing the insulating film material with other silane compounds or the like.

No specific limitation is placed on the structure, density, thickness, dielectric constant, or the like of the interlayer insulating film and they can be selected appropriately according to the object. The structure may be a monolayer structure or a laminated structure.

No specific limitation is placed on the density and it can be selected appropriately according to the object, but the porosity is preferably 10% to 80%, more preferably 30% to 60%.

Where the porosity is less than 10%, a low dielectric constant of the interlayer insulating film is sometimes difficult to maintain, and where the porosity is more than 80%, the strength of the interlayer insulating film decreases and the insulating film sometimes cannot be used for the multilayer interconnection structure.

No specific limitation is placed on a method for measuring the porosity and it can be selected appropriately according to the object. For example, the porosity can be measured by a nitrogen gas adsorption method.

No specific limitation is placed on the thickness and it can be selected appropriately according to the object. The preferred thickness is 2 nm to 300 nm.

Where the thickness is less than 2 nm, structural defects such as pinholes sometimes occur, and where the thickness is more than 300 nm, the final parasitic capacitance sometimes rises due to the increase in the interconnection height. No specific limitation is placed on the dielectric constant and it can be selected appropriately according to the object, but the lower is the dielectric constant the better. More specifically, the dielectric constant is preferably equal to or less than 3.0, more preferably equal to or less than 2.5, and even more preferably equal to or less than 2.0. The dielectric constant can be measured by forming gold electrodes on the interlayer insulating film and using a dielectric constant meter or the like.

The interlayer insulating film preferably has the below-described etching resistance and resistance to liquid reagents.

The etching resistance can be evaluated by the etching rate. No specific limitation is placed on the etching rate and it can be selected appropriately according to the object. However, the etching rate varies depending on the gas type, pressure, voltage, and the like. For example, the ratio of the etching rate of the interlayer insulating film formed using the insulating film material to the etching rate of another interlayer insulating film (for example, a porous silica film) in the case where a $CF_4/CHF_3$ gas is used as the etching gas (etching rate of the interlayer insulating film:etching rate of the porous silica film) is preferably 1:1.5 to 1:10.0.

The etching rate can be measured, for example, by measuring the film amount reduction quantity of a sample material by using a well-known etching device and performing etching for a predetermined time and then computing the film amount reduction quantity per unit time.

No specific limitation is placed on the resistance to liquid reagents and it can be selected appropriately according to the object. For example, the resistance to liquid reagents can be evaluated by observing the solubility of a sample immersed in NaOH, and poor solubility in NaOH is preferred.

The insulating film formed using the insulating film material is preferably used as an etching stopper or a protective film during chemical-mechanical polishing (CMP stopper film) in the multilayer interconnection structure. In this case, because the insulating film formed from the insulating film material that comprises a silicon compound having a steric structure represented by the Structural Formula (1) has a low dielectric constant and excels in resistance to damage such as etching resistance and resistance to liquid reagents, a fine pattern can be easily formed.

Physical properties of the insulating film functioning as the etching stopper film and CMP stopper film are preferably identical to physical properties of the above-described interlayer insulating film.

Because the multilayer interconnection structure including a multilayer insulating film that is formed using the insulating film material has a lower dielectric constant, and excels in resistance to damage, the multilayer interconnection structure has a reduced parasitic capacitance, signal propagation speed can be increased, and the multilayer interconnection structure is especially suitable to semiconductor integrated circuit devices with a high degree of integration, such as IC and LSI, that require an increased response speed.

The multilayer interconnection structure can be manufactured by the well-known method, but it can be advantageously manufactured by the below-described method for manufacturing a multilayer interconnection structure.

(Method for Manufacturing a Multilayer Interconnection Structure)

The method for manufacturing a multilayer interconnection structure comprises at least a step of forming an insulating film, a step of forming an interconnection pattern, and a step of forming an interconnection, and also includes, if necessary, other steps that are selected appropriately.

<Step of Forming an Insulating Film>

In the step of forming an insulating film, an insulating film is formed using the insulating film material on the surface to be processed.

The insulating film material has been described in detail hereinabove when explaining the insulating film material. Examples of the insulating film to be formed include the aforementioned etching stopper film and CMP stopper film in addition to the interlayer insulating film.

No specific limitation is placed on the surface to be processed and it can be selected appropriately according to the object. For example, is when the multilayer interconnection structure is used in a semiconductor device, the surface or a semiconductor substrate or the like, more specifically the surface of a substrate such as a silicon wafer, or the surface of oxidation films of various types serve as the surface to be processed.

No specific limitation is placed on the method for forming the interlayer insulating film, and this method can be selected appropriately according to the object. For example, a coating method can be advantageously employed.

No specific limitation is placed on the coating method and it can be selected appropriately according to the object. Examples of suitable methods include spin coating, dip coating, kneader coating, curtain coating, and blade coating. Among these methods, spin coating is preferred because of good coating efficiency thereof. When spin coating is employed, the conditions thereof include, for example, a rotation speed of about 100 rpm to 10,000 rpm, preferably 800 rpm to 5,000 rpm, and a time of about 1 sec to 10 min, preferably 10 sec to 90 sec.

In the step of forming an insulating film, it is preferred that heat treatment be implemented, the solvent be dried, and the calcination of the insulating film material be performed each time the insulating film is formed (the insulating film material is coated). In this case, oxidation of hydrocarbons or the like in the steric structure represented by the Structural Formula (1) in the insulating film material can be inhibited.

No specific limitation is placed on the heat treatment method and it can be selected appropriately according to the object. For example, it is preferred that heating be performed using a hot plate.

Appropriate conditions of the heat treatment, such as temperature and atmosphere, can be selected appropriately according to the object. The temperature is preferably 50° C. to 400° C., more preferably 150° C. to 350° C.

Where the heat treatment temperature is less than 50° C., the solvent practically does not evaporate and remains in the film, thereby making it impossible to obtain a sufficient film strength. Where the heat treatment temperature is above 400° C., Si—R—Si bonds present in the steric structure represented by the Structural Formula (1) are sometimes broken.

As for the heat treatment atmosphere, because inclusion of oxygen contained in the air increases dielectric constant, it is preferred that the heat treatment be performed under reduced pressure in the presence of an inactive gas. Nitrogen is a preferred example of the inactive gas.

When the prime layer of the insulating film is a film formed, for example, by spin coating (for example, a film with a low dielectric constant such as a porous silica film), the heat treatment may be performed for a process including the steps of coating a material for forming the film with a low dielectric constant, drying the solvent, and then coating the insulating film material thereupon. In this case, the cost of film formation can be reduced.

The insulating film is formed by the above-described process by using the insulating film material on the surface to be processed.

<Step of Forming an Interconnection Pattern>

The step of forming an interconnection pattern is a step for forming an interconnection pattern by etching the insulating film.

The interconnection pattern can be formed by etching the insulating film using a resist film with a desired pattern that is formed of a well-known resist material and that is prepared by selective exposure and development.

No specific limitation is placed on the etching method and it can be selected appropriately according to the object. Thus, dry etching or wet etching may be used, but the preferred examples include plasma treatment and coating a liquid reagent. The interconnection pattern is formed by above-described process.

<Step of Forming an Interconnection>

The step of forming an interconnection is a step for forming an interconnection by using the interconnection pattern.

The interconnection formation can be performed by covering a conductor as an interconnection precursor on space portions in the interconnection pattern formed by etching the insulating film.

The conductor can be covered by using the well-known plating methods, for example, regular plating methods such as electroless plating and electroplating. The interconnection is formed by the above-described process.

A multilayer interconnection structure with a high degree of circuit integration can be manufactured by repeatedly performing, as necessary, the sequence of processes that includes the step of forming an insulating film, the step of forming an interconnection pattern, and a step of forming an interconnection.

The method for manufacturing a multilayer interconnection structure can be advantageously used in a variety of fields, but can be especially advantageously employed for manufacturing the multilayer interconnection structure.

(Method for Manufacturing a Semiconductor Device)

A method for manufacturing a semiconductor device of the present invention comprises at least a step of forming a multilayer interconnection structure and can also include, if necessary, other steps that are selected appropriately.

<Step of Forming a Multilayer Interconnection Structure>

The step of forming a multilayer interconnection structure is a step for forming a multilayer interconnection by using the method for manufacturing a multilayer interconnection on a surface to be processed.

The surface to be processed and the method for manufacturing a multilayer interconnection structure have been described in greater detail hereinbelow when explaining the method for manufacturing a multilayer interconnection structure.

<Other Steps>

No specific limitation is placed on other steps and they can be selected appropriately according to the object. Examples of such steps include various processes that have been used in general methods for fabricating semiconductor devices, such as electrode formation processes for forming a gate electrode, drain electrode, and source electrode.

A semiconductor device having at least the multilayer interconnection structure is manufactured by the above-described process. This semiconductor device has the multilayer interconnection structure having at least the interconnection layers and the insulating film and can have, if necessary, other members that are selected appropriately.

No specific limitation is placed on the other members and they can be selected appropriately as necessary. Examples of such members include general structural members of semiconductor devices of various type, such as gate electrodes, drain electrodes, and source electrodes.

With the method for manufacturing a semiconductor device, it is possible to reduce a parasitic capacitance between the interconnections, decrease an interconnection resistance, increase a signal propagation speed, and fabricate a high-performance semiconductor device with high efficiency.

Further, because the semiconductor device obtained is formed using the insulating film material and comprises at least the multilayer interconnection structure that has an insulating film with excellent resistance to damage, the parasitic capacitance between the interconnections can be reduced, the interconnection resistance can be decreased, and high reliability can be attained at a high rate. For this reason, such fabrication method is especially suitable for fabricating flash memories, DRAMs, FRAMs, MOS transistors, and the like.

EXAMPLES

Examples of the present invention will be described below, but the present invention is not limited to the below-described Examples in any way.

Example 1

Preparation of Insulating Film Material

A total of 88 g (0.9 mol) of sulfuric acid and 33 g of fuming sulfuric acid (60% $SO_4$) were charged into a reaction container equipped with a nitrogen gas introducing tube and a metering pump for liquids, 87 g (0.95 mol) of toluene was dropwise added under a condition of 2 mL/min with the metering pump, and a maturing reaction was conducted for 1 h after completion of addition.

Then, a starting material solution obtained by diluting 103 g (0.45 mol) of 1,1,3,3-tetrachloro-1,3-disilabutane to 20% by mass with toluene was dropwise added under a condition of 2 mL/min with the metering pump, and a maturing reaction was conducted for 2 h after completion of addition.

Upon completion of the reaction, 100 mL of a 50% by mass aqueous solution of sulfuric acid was added, the precipitated toluenesulfonic acid was filtered, and the excessive aqueous sulfuric acid was removed with a separating funnel.

Sulfuric acid remaining in the solution thus obtained was neutralized with 2 g of calcium carbonate and dehydration was performed with 5 g of magnesium sulfate. The solution was then dropwise added to 1 L of acetonitrile and a reaction product of a ladder structure was removed.

The solution was then passed through a column packed with silica particles, and a silicon compound of a steric structure with a molecular weight of from 200 to 50,000 was separated. The molecular weight was confirmed by GPC (gel permeation chromatography); the weight-average molecular weight was about 5,200.

Acetonitrile was then completely removed using a rotary evaporator, and 17 g of a solid silicon compound of a cubic structure was obtained.

The silicon compound thus obtained was analyzed by infrared spectroscopy (IR), and a structure represented by the Structural Formula (2) below was confirmed.

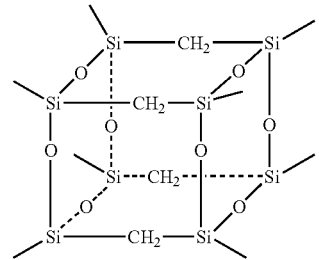

Structural formula (2)

The obtained silicon compound was dissolved in 75 g of methyl isobutyl ketone to prepare a solution (insulating film material) with a concentration of solids of 18.5% by mass.

Example 2

Preparation of Insulating Film Material

A total of 88 g (0.9 mol) of sulfuric acid and 33 g of fuming sulfuric acid (60% $SO_4$) were charged into a reaction container equipped with a nitrogen gas introducing tube and a metering pump for liquids, 87 g (0.95 mol) of toluene was dropwise added under a condition of 2 mL/min with the metering pump, and a maturing reaction was conducted for 1 h after completion of dropping.

Then, a starting material solution obtained by diluting 115 g (0.45 mol) of bis(methyldichlorosilyl)ethane to 20% by mass with toluene was dropwise added under a condition of 2 mL/min with the metering pump, and a maturing reaction was conducted for 2 h after completion of addition.

Upon completion of the reaction, 100 mL of a 50% by mass aqueous solution of sulfuric acid was added, the precipitated toluenesulfonic acid was filtered, and the excessive aqueous sulfuric acid was removed with a separating funnel.

Sulfuric acid remaining in the solution thus obtained was neutralized with 2 g of calcium carbonate and dehydration was performed with 5 g of magnesium sulfate. The solution was then dropwise added to 1 L of acetonitrile and a reaction product of a ladder structure was removed.

Acetonitrile was then completely removed using a rotary evaporator, and 15 g of a solid silicon compound of a rectangular parallelepiped structure was obtained.

The silicon compound thus obtained was analyzed by infrared spectroscopy (IR), and a structure represented by the Structural Formula (3) below was confirmed.

Structural formula (3)

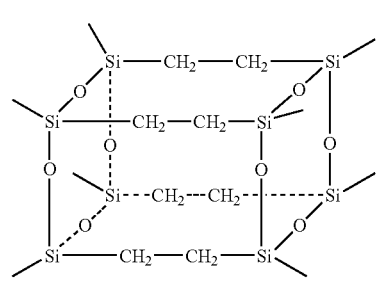

The obtained silicon compound was dissolved in 66 g of methyl isobutyl ketone to prepare a solution (insulating film material) with a concentration of solids of 18.5% by mass.

Example 3

Preparation of Insulating Film Material

A total of 88 g (0.9 mol) of sulfuric acid and 33 g of fuming sulfuric acid (60% $SO_4$) were charged into a reaction container equipped with a nitrogen gas introducing tube and a metering pump for liquids, 87 g (0.95 mol) of toluene was dropwise added under a condition of 2 mL/min with the metering pump, and a maturing reaction was conducted for 1 h after completion of dropping.

Then, a starting material solution obtained by diluting 128 g (0.45 mol) of bis(methyldichlorosilyl)butane to 20% by mass with is toluene was dropwise added under a condition of 2 mL/min with the metering pump, and a maturing reaction was conducted for 2 h after completion of dropping.

Upon completion of the reaction, 100 mL of a 50% by mass aqueous solution of sulfuric acid was added, the precipitated toluenesulfonic acid was filtered, and the excessive aqueous sulfuric acid was removed with a separating funnel.

Sulfuric acid remaining in the solution thus obtained was neutralized with 2 g of calcium carbonate and dehydration was performed with 5 g of magnesium sulfate. The solution was then dropwise added to 1 L of acetonitrile and a reaction product of a ladder structure was removed.

Acetonitrile was then completely removed using a rotary evaporator, and 12 g of a solid silicon compound of a rectangular parallelepiped structure was obtained.

The silicon compound thus obtained was analyzed by infrared spectroscopy (IR), and a structure represented by the Structural Formula (4) below was confirmed.

Structural formula (4)

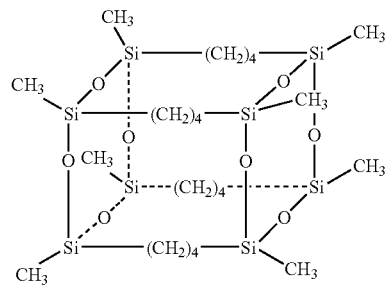

The obtained silicon compound was dissolved in 53 g of methyl isobutyl ketone to prepare a solution (insulating film material) with a concentration of solids of 18.5% by mass.

Example 4

Preparation of Insulating Film Material

A solution from which the reaction product of a ladder structure has been removed in the same manner as in Example 2 was passed through a column packed with silica particles, and a silicon compound of a rectangular parallelepiped structure with a molecular weight equal to or less than 200 was separated. The molecular weight was confirmed by GPC (gel permeation chromatography); the weight-average molecular weight was about 130.

Acetonitrile was then completely removed using a rotary evaporator, and 7 g of a solid silicon compound of a rectangular parallelepiped structure was obtained.

The silicon compound thus obtained was analyzed by infrared spectroscopy (IR), and a structure represented by the Structural Formula (3) above was confirmed.

The obtained silicon compound was dissolved in 30.8 g of methyl isobutyl ketone to prepare a solution (insulating film material) with a concentration of solids of 18.5% by mass.

Example 5

Preparation of Insulating Film Material

A solution from which the reaction product of a ladder structure has been removed in the same manner as in Example 2 was passed through a column packed with silica particles, and a silicon compound of a rectangular parallelepiped structure with a molecular weight equal to or more than 40,000 was separated. The molecular weight was confirmed by GPC (gel permeation chromatography); the weight-average molecular weight was about 51,000.

Acetonitrile was then completely removed using a rotary evaporator, and 8 g of a solid silicon compound of a rectangular parallelepiped structure was obtained.

The silicon compound thus obtained was analyzed by infrared spectroscopy (IR), and a structure represented by the Structural Formula (3) above was confirmed.

An attempt was made to dissolve the obtained silicon compound in methyl isobutyl ketone, but solubility was poor.

Comparative Example 1

Preparation of Insulating Film Material

Hydro-T8-silsesquioxane represented by Structural Formula (5) below was used as the silicon compound, and a 17% by mass to 20% by mass methyl isobutyl ketone solution of the hydro-T8-silsesquioxane was prepared.

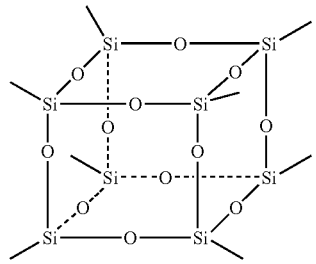

Structural formula (5)

Comparative Example 2

Preparation of Insulating Film Material

A total of 88 g (0.9 mol) of sulfuric acid and 33 g of fuming sulfuric acid (60% $SO_4$) were charged into a reaction container equipped with a nitrogen gas introducing tube and a metering pump for liquids, 87 g (0.95 mol) of toluene was dropwise added under a condition of 2 mL/min with the metering pump, and a maturing reaction was conducted for 1 h after completion of dropping.

Then, a starting material solution obtained by diluting 103 g (0.45 mol) of 1,1,3,3-tetrachloro-disilabutane to 20% by mass with toluene was dropwise added under a condition of 2 mL/min with the metering pump, and a maturing reaction was conducted for 2 h after completion of dropping.

Upon completion of the reaction, 100 mL of a 50% by mass aqueous solution of sulfuric acid was added, the precipitated toluenesulfonic acid was filtered, and the excessive aqueous sulfuric acid was removed with a separating funnel.

Sulfuric acid remaining in the solution thus obtained was neutralized with 2 g of calcium carbonate and dehydration was performed with 5 g of magnesium sulfate. The solution was then dropwise added to 1 L of acetonitrile and a reaction product of a cubic structure was removed.

Toluene was then completely removed using a rotary evaporator, and 25 g of a solid silicon compound of a ladder structure was obtained.

The silicon compound thus obtained was analyzed by infrared spectroscopy (IR), and a structure represented by the Structural Formula (6) below was confirmed.

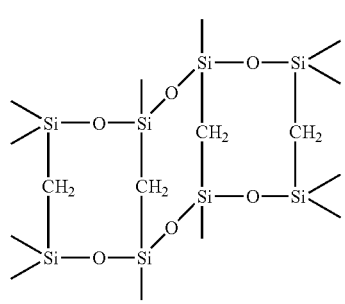

Structural formula (6)

The obtained silicon compound was dissolved in 110 g of methyl isobutyl ketone to prepare a solution (insulating film material) with a concentration of solids of 18.5% by mass.

Comparative Example 3

Preparation of Insulating Film Material

A total of 88 g (0.9 mol) of sulfuric acid and 33 g of fuming sulfuric acid (60% $SO_4$) were charged into a reaction container equipped with a nitrogen gas introducing tube and a metering pump for liquids, 87 g (0.95 mol) of toluene was dropwise added under a condition of 2 mL/min with the metering pump, and a maturing reaction was conducted for 1 h after completion of addition.

Then, a starting material solution obtained by diluting 115 g (0.45 mol) of bis(methyldichlorosilyl)ethane to 20% by mass with toluene was dropwise added under a condition of 2 mL/min with the metering pump, and a maturing reaction was conducted for 2 h after completion of dropping.

Upon completion of the reaction, 100 mL of a 50% by mass aqueous solution of sulfuric acid was added, the precipitated toluenesulfonic acid was filtered, and the excessive aqueous sulfuric acid was removed with a separating funnel.

Sulfuric acid remaining in the solution thus obtained was neutralized with 2 g of calcium carbonate and dehydration was performed with 5 g of magnesium sulfate. The solution was then dropwise added to 1 L of acetonitrile and a reaction product of a cubic structure was removed.

Toluene was then completely removed using a rotary evaporator, and 28 g of a solid silicon compound of a ladder structure was obtained.

The silicon compound thus obtained was analyzed by infrared spectroscopy (IR), and a structure represented by the Structural Formula (7) below was confirmed.

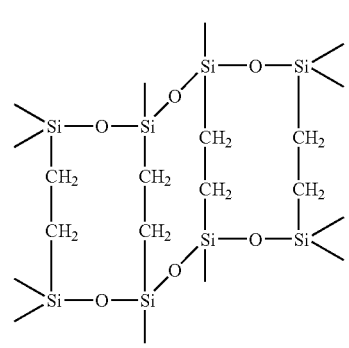

Structural formula (7)

The obtained silicon compound was dissolved in 123 g of methyl isobutyl ketone to prepare a solution (insulating film material) with a concentration of solids of 18.5% by mass.

Examples 6 to 10 and Comparative Examples 4 to 6

Fabrication of Insulating Film

Insulating films of a solid film form of Examples 6 to 10 and Comparative Examples 4 to 6 were fabricated by the below-described method by using the insulating film materials obtained in Examples 1 to 5 and Comparative Examples 1 to 3.

The insulating film materials obtained in Examples 1 to 5 and Comparative Examples 1 to 3 were coated on respective silicon substrates by spin coating at a revolution rate of 1,500 rpm within a coating time of 30 sec to obtain a thickness of 300 nm. The silicon substrates were then placed on a hot plate that was set to a temperature of 200° C. and the solvent was dried for 3 min.

Then, calcination was conducted for 30 min at 400° C. in an electric furnace with a $N_2$ gas atmosphere and insulating films were fabricated.

In the insulating film of Example 9 that used the insulating film material of Example 4, portions of the film were lost during film formation. In the insulating film material of Example 5, the silicon compound had poor solubility in the solvent. As a result, a uniform insulating film of Example 10 was difficult to form.

Example 11

Fabrication of Insulating Film

The insulating film material obtained in Example 3 was coated on a silicon substrate by spin coating at a revolution rate of 1,500 rpm within a coating time of 30 sec to obtain a thickness of 300 nm. The silicon substrate was then placed on a hot plate set to a temperature of 200° C. and the solvent was dried for 3 min to fabricate an insulating film. No calcination was performed after the solvent has been dried.

The C/O atomic ratio, porosity, dielectric constant, etching rate, resistance to liquid reagents, and strength of the insulating films obtained in the above-described manner were measured by the below-described methods. The results are shown in Table 1.

<Measurement of C/O Atomic Ratio>

The C/O atomic ratio was measured by X ray photoelectron spectroscopy.

<Measurement of Porosity>

The porosity was measured by a nitrogen gas adsorption method.

<Measurement of Dielectric Constant>

A metallic pole with a diameter of 1 mm was produced on an insulating film produced on a low-resistance substrate, a capacitance was measured using a prober connected to a 1 MHz, 1 V AC power source, and the dielectric constant was calculated from the capacitance and the insulating film thickness. The degree of dielectric constant increase was also evaluated by measuring the dielectric constant of the insulating film after measuring the etching rate.

<Measurement of Etching Rate>

A porous silica film ("Ceramate NCS"; product of Shokubai Kasei Kogyo KK) was formed on a silicon substrate to a thickness of 300 nm.

The porous silica film thus obtained and also insulating films fabricated by using insulating film materials of Examples 1 to 3 were dry etched with F plasma using $CF_4$/$CHF_3$ gas as a starting material, and the etching rate ratios of the porous silica film and the insulating films were measured.

<Evaluation of Resistance to Liquid Reagents>

A silicon substrate with the insulating film formed thereon was immersed for 10 min in 5% by mass NaOH, and the solubility of the insulating film in NaOH was evaluated from the reduction ratio of film thickness by spectral ellipsometry.

<Film Strength>

The film strength was measured by a nanoindentation method at an indentation amount of 20 nm.

TABLE 1

| | Insulating film material | | | | | | | |
|---|---|---|---|---|---|---|---|---|
| | Ex. 1 | Ex. 2 | Ex. 3 | Ex. 4 | Example 5 | Comp. Ex. 1 | Comp. Ex. 2 | Comp. Ex. 3 |
| Structure | Cube | Rectangular parallelepiped | Rectangular parallelepiped | Rectangular parallelepiped | Rectangular parallelepiped | Cube | Ladder | Ladder |
| Functional group | —CH2— | —(CH2)2— | —(CH2)4— | —(CH2)2— | —(CH2)2— | —O— | —CH2— | —(CH2)2— |
| Weight-average molecular weight | 5,200 | — | — | 130 | 51,000 | — | — | — |

| | Insulating film | | | | | | | |
|---|---|---|---|---|---|---|---|---|
| | Ex. 6 | Ex. 7 | Ex. 8 | Ex. 11 | Ex. 9 | Ex. 10 | Comp. Ex. 4 | Comp. Ex. 5 | Comp. Ex. 6 |
| C/O atomic ratio | 0.86 | 0.72 | 4.80 | 5.11 | 1.20 | 0.65 | 0.14 | 0.84 | 0.71 |
| Porosity (%) | 43.6 | 47.2 | 52.3 | 63.5 | 49.2 | 47.0 | 42.2 | 37.5 | 39.1 |
| Dielectric constant | 2.11 | 2.03 | 1.92 | 1.88 | 1.99 | 2.14 | 2.23 | 2.26 | 2.13 |
| Increase in dielectric constant after etching | <0.1 | <0.1 | <0.1 | <0.1 | <0.1 | <0.1 | 0.71 | <0.1 | <0.1 |
| Etching rate ratio (Insulating film:Porous silica film) | 1.0:5.1 | 1.0:3.9 | 1.0:7.5 | 1.0:8.6 | 1.0:7.2 | 1.0:2.3 | 1.0:1.1 | 1.0:5.2 | 1.0:4.0 |
| Film thickness decrease ratio (%@NaOH) | <1.0 | <1.0 | <1.0 | <1.0 | <1.0 | <1.0 | 100 | <1.0 | <1.0 |
| Film strength (GPa) | 12.3 | 11.5 | 9.9 | 3.7 | 7.8 | 14.0 | 11.9 | 4.8 | 4.4 |

Table 1 demonstrates that the insulating films produced using the insulating film materials of Examples 1 to 3 have a low dielectric constant that shows practically no increase after etching, excel in resistance to liquid reagents and etching resistance (etching rate ratio), and also have a good strength.

Further, the insulating film of Example 9 that was formed using the insulating film material of Example 4 in which the weight-average molecular weight of the silicon compound was equal to or less than 200 had excellent properties, but film unevenness easily occurred. The insulating film of Example 10 that was formed using the insulating film material of Example 5 in which the weight-average molecular weight of the silicon compound was equal to or more than 50,000, was hardly soluble in the solvent.

Further, it was found that although the insulating film of Example 11 in which the C/O atomic ratio exceeded 5.0 was superior to the insulating film of Example 8 in which the C/O atomic ratio was 5.0 or less in terms of dielectric constant and etching rate ratio, the film strength of the former was lower that that of the latter.

Examples 12 to 15 and Comparative Example 7

Fabrication of Insulating Film

Mixed solutions of compositions shown in Table 2 below were prepared by using the insulating film material prepared in Example 1, tetraethoxysilane (TEOS), 500 ppm aqueous nitric acid, and methyl isobutyl ketone (MIBK). The mixed solutions obtained were spin coated on respective silicon substrates by spin coating at a revolution speed of 1,500 rpm and a coating time of 30 sec to a thickness of 300 nm. Then, the silicon substrates were placed on a hot plate that was set to a temperature of 200° C., and the solvent was dried for 3 min.

Calcination was then performed within 30 min at 400° C. in an electric furnace under a $N_2$ gas atmosphere and insulating films were fabricated.

The C/O atomic ratio, dielectric constant, and etching rate were measured for the insulating films obtained. The results are shown in Table 2.

TABLE 2

| | | Insulating film | | | | |
|---|---|---|---|---|---|---|
| | | Ex. 12 | Ex. 13 | Ex. 14 | Ex. 15 | Comp. Ex. 7 |
| Composition of mixed solution | TEOS (mol) | 0.01 | 0.02 | 0.03 | 0.04 | 0.1 |
| | Solution (g) of Example 1 | 20 | 20 | 20 | 20 | — |
| | 500 ppm aqueous nitric acid (mol@ $H_2O$) | 0.05 | 0.05 | 0.06 | 0.06 | 0.5 |
| | MIBK (g) | 11 | 22 | 33 | 44 | 110 |
| C/O atomic ratio | | 0.70 | 0.48 | 0.21 | 0.18 | 0.13 |
| Dielectric constant | | 2.16 | 2.88 | 3.23 | 3.67 | 4.11 |
| Increase in dielectric constant after etching | | <0.1 | 0.23 | 0.41 | 0.55 | 0.72 |
| Etching rate ratio (insulating film:porous silica film) | | 1.0:4.3 | 1.0:2.9 | 1.0:2.1 | 1.0:1.5 | 1.0:0.8 |

Table 2 shows that the dielectric constant decreases, the increase in dielectric constant after etching also decreases, and the etching resistance (etching rate ratio) improves with the increase in the content of the insulating film material prepared in Example 1 in the total amount of the mixed solvent. Furthermore, the insulating film having less than 0.2 C/O atomic ratio in Example 15 exhibits an inferior dielectric constant and etching rate ratio in comparison to the insulating film having at least 0.2 C/O atomic ratio in Example 14.

Example 16

Manufacture of Multilayer Interconnection Structure and Semiconductor Device

An insulating film was formed by using the insulating film material and the multilayer interconnection structure and semiconductor device were manufactured in the following manner.

First, as shown in FIG. 1A, an element separation film 12 was formed by LOCOS (LOCal Oxidation of Silicon) on a semiconductor substrate 10. An element region 14 was delineated by the element separation film 12. A silicon substrate was used as the semiconductor substrate 10.

Then, a gate electrode 18 was formed via a gate insulating film 16 on the element region 14. A side wall insulating film 20 was then formed on the side surface of the gate electrode 18. A source/drain diffusion layer 22 was thereafter formed within the semiconductor substrate 10 on both sides of the gate electrode 18 by introducing a dopant impurity into the semiconductor substrate 10 by using the side wall insulating film 20 and gate electrode 18 as masks. As a result, a transistor 24 having the gate electrode 18 and the source/drain diffusion layer 22 was formed.

Figure 1B:
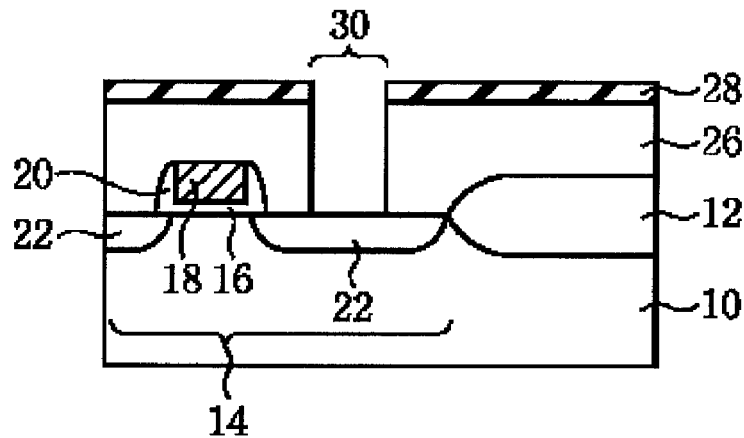
FIG. 1B is a process diagram (second) illustrating examples of methods for manufacturing a multilayer interconnection structure and a semiconductor device that have an insulating film formed by using the insulating film material.

Then, as shown in FIG. 1B, an interlayer insulating film 26 containing a silicon oxide film was formed by CVD on the entire surface of the semiconductor substrate 10 where the transistor 24 was formed. A stopper film 28 with a thickness of 50 nm containing a SiN film formed by plasma CVD was then formed on the interlayer insulating film 26. When a tungsten film 34 or the like was polished by chemical-mechanical polishing (CMP) in the below-described process, the stopper film 28 functioned as a stopper (see FIG. 1C), and when a groove 46 was formed in the interlayer insulating film 38 or the like, the stopper film functioned as an etching stopper (see FIG. 3A). A contact hole 30 reaching the source/drain diffusion layer 22 was then formed by using a photolithography technique.

Figure 1C:
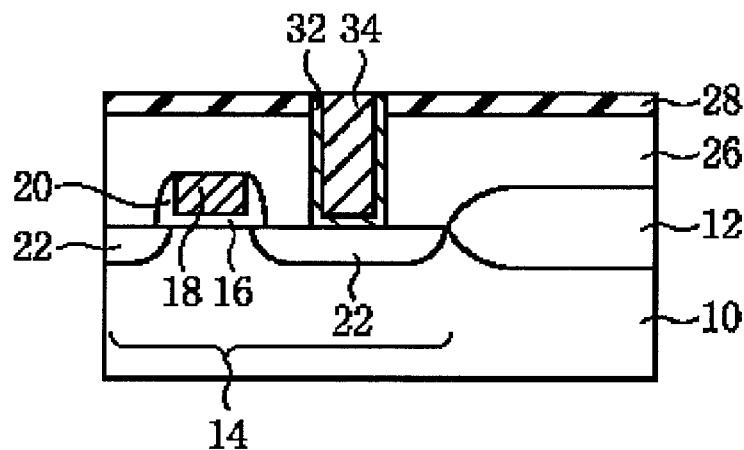
FIG. 1C is a process diagram (third) illustrating examples of methods for manufacturing a multilayer interconnection structure and a semiconductor device that have an insulating film formed by using the insulating film material.

An adhesive layer 32 containing a TiN film having a thickness of 50 nm was then formed over the entire surface by sputtering. The adhesive layer 32 can ensure adhesivity to the below-described conductor plug 34 to the base. A tungsten film 34 with a thickness of 1 μm was then formed by CVD over the entire surface of the adhesive layer 32, and the adhesive layer 32 and the tungsten film 34 were polished by chemical-mechanical (CMP) till the surface of the stopper film 28 was exposed. As a result, the conductor plug 34 composed of tungsten was embedded in the contact hole 30, as shown in FIG. 1C.

Figure 2A:
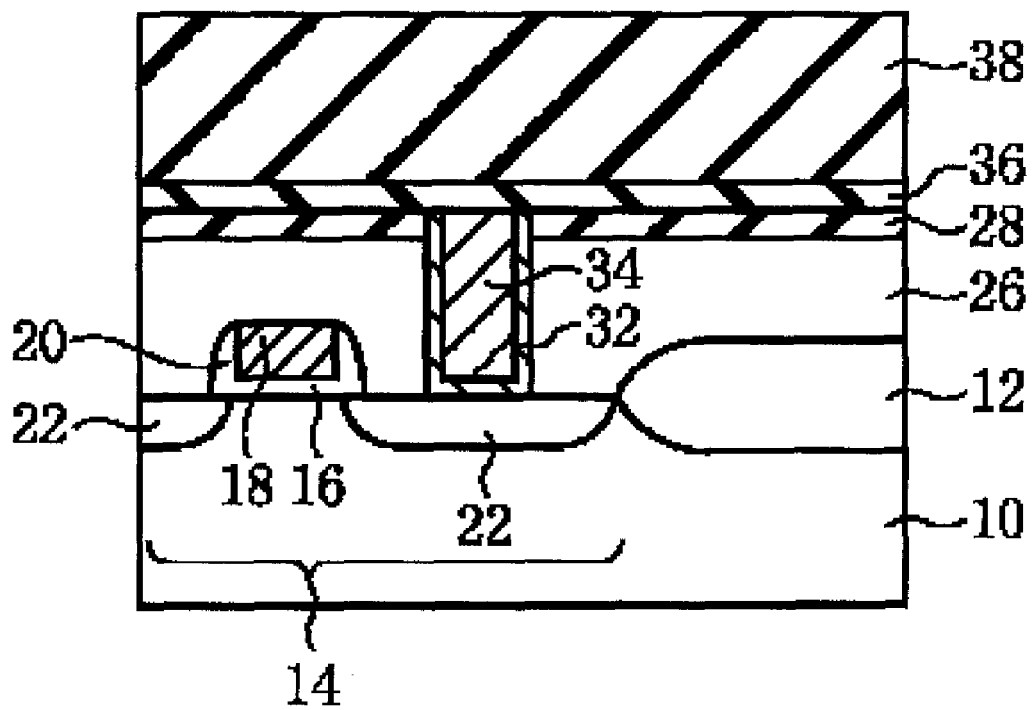
FIG. 2A is a process diagram (fourth) illustrating examples of methods for manufacturing a multilayer interconnection structure and a semiconductor device that have an insulating film formed by using the insulating film material.

Then, as shown in FIG. 2A, an insulating film 36 with a thickness of 30 nm (equivalent to the insulating film fabricated in any of Examples 6 to 8 and Example 11; sometimes referred to hereinbelow as "example film") was formed over the entire surface by using the insulating film material prepared in any of Examples 1 to 3, and the film formed was subjected to heat treatment.

An interlayer insulating film 38 (sometimes referred to hereinbelow as "porous silica film") composed of porous silica was then formed over the entire surface of the example film 36 to a thickness of 160 nm. The porous silica film 38 was then subjected to heat treatment.

Figure 2B:
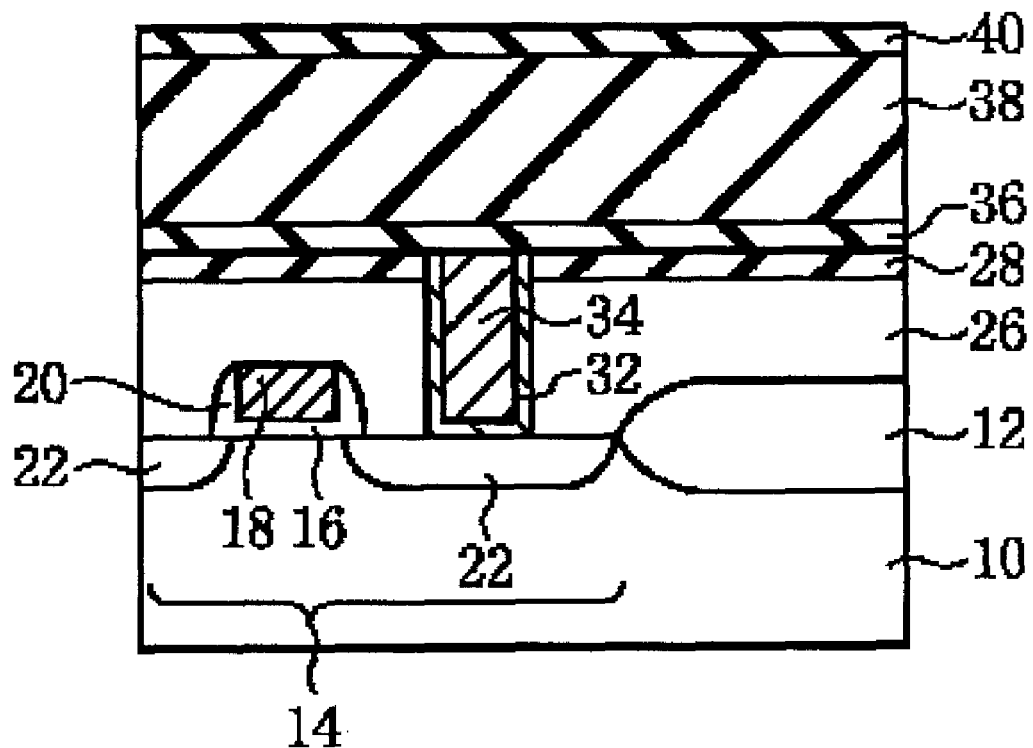
FIG. 2B is a process diagram (fifth) illustrating examples of methods for manufacturing a multilayer interconnection structure and a semiconductor device that have an insulating film formed by using the insulating film material.

Then, as shown in FIG. 2B, an example film 40 with a thickness of 30 nm was formed by the same process as the example film 36 on the entire surface of the semiconductor substrate 10 where the porous silica film 38 was formed.

Figure 3A:
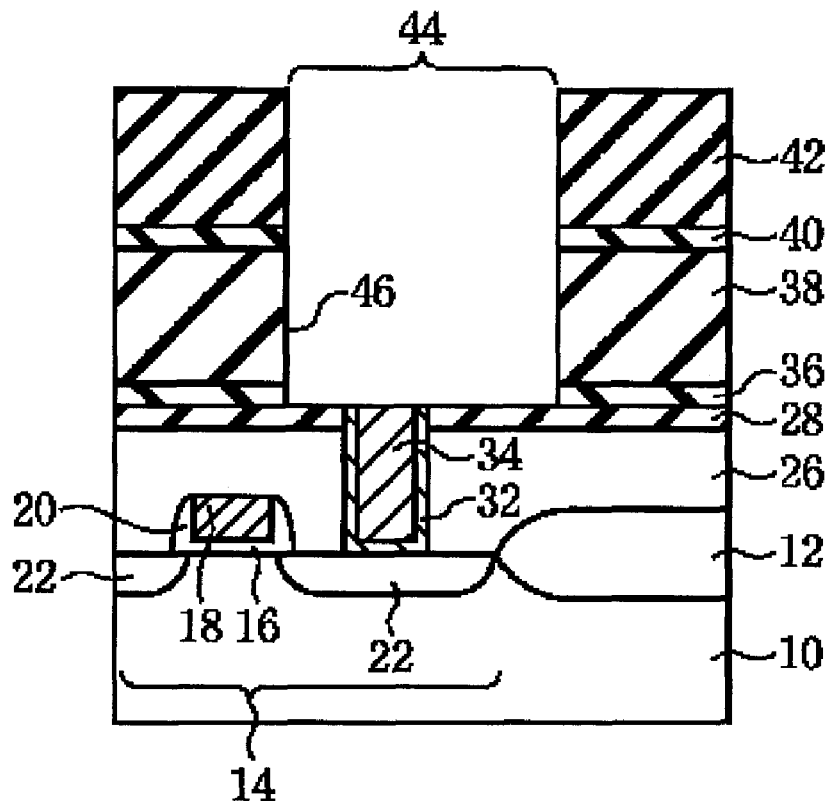
FIG. 3A is a process diagram (sixth) illustrating examples of methods for manufacturing a multilayer interconnection structure and a semiconductor device that have an insulating film formed by using the insulating film material.

Then, as shown in FIG. 3A, a photoresist film 42 was formed by spin coating over the entire surface of the example film 40. An opening 44 was then formed in the photoresist film 42 by using a photolithography technique. Here, the opening 44 served to form the below-described first-layer interconnection (first metal interconnection layer) 50 (see FIG. 3B) and had the dimensions such as to obtain an interconnection width of 100 nm and an interconnection spacing of 100 nm.

The example film 40, porous silica film 38, and example film 36 were then etched by using the photoresist film 42 as the mask. The etching was performed using $CF_4$ gas and $CHF_3$ gas as starting materials. At this time, the stopper film 28 functioned as an etching stopper. As a result, a groove (trench) 46 for embedding the interconnection was formed in the example film 40, porous silica film 38, and example film 36. The upper surface of the conductor plug 34 assumed a state in which it was exposed in the groove 46. The photoresist 42 was then peeled off.

A barrier film (not shown in the figure) composed of TaN and having a thickness of 10 nm was then formed over the entire surface by sputtering. The barrier film has a function of preventing Cu contained in the below-described interconnection from diffusing into the insulating film. A seed film (not shown in the figure) composed of Cu and having a thickness of 10 nm was then formed over the entire surface by sputtering. The seed film functioned as an electrode when an interconnection containing Cu was formed by electroplating. A laminated film 48 composed of the barrier film and seed film was thus formed as shown in FIG. 3B.

A Cu film 50 with a thickness of 600 nm was then formed by electroplating.

The Cu film 50 and laminated film 48 were then polished by chemical-mechanical polishing (CMP) till the surface of the example film 40 was exposed. As a result, the interconnection 50 containing Cu was embedded in the groove 46. The above-described method for manufacturing the interconnection 50 is called a single damascene method.

Figure 3B:
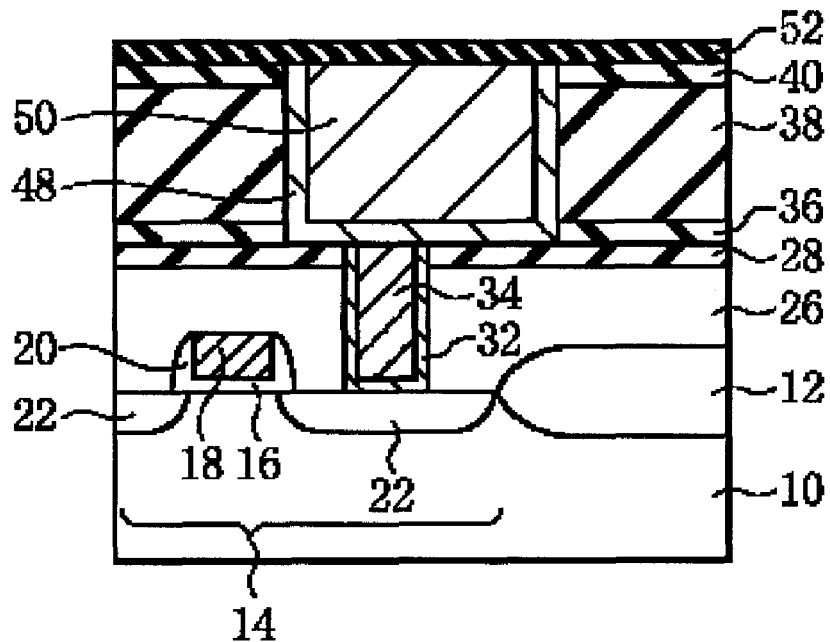
FIG. 3B is a process diagram (seventh) illustrating examples of methods for manufacturing a multilayer interconnection structure and a semiconductor device that have an insulating film formed by using the insulating film material.

Then, as shown in FIG. 3B, an example film 52 with a thickness of 30 nm was formed in the same manner as the example film 36.

Figure 4:
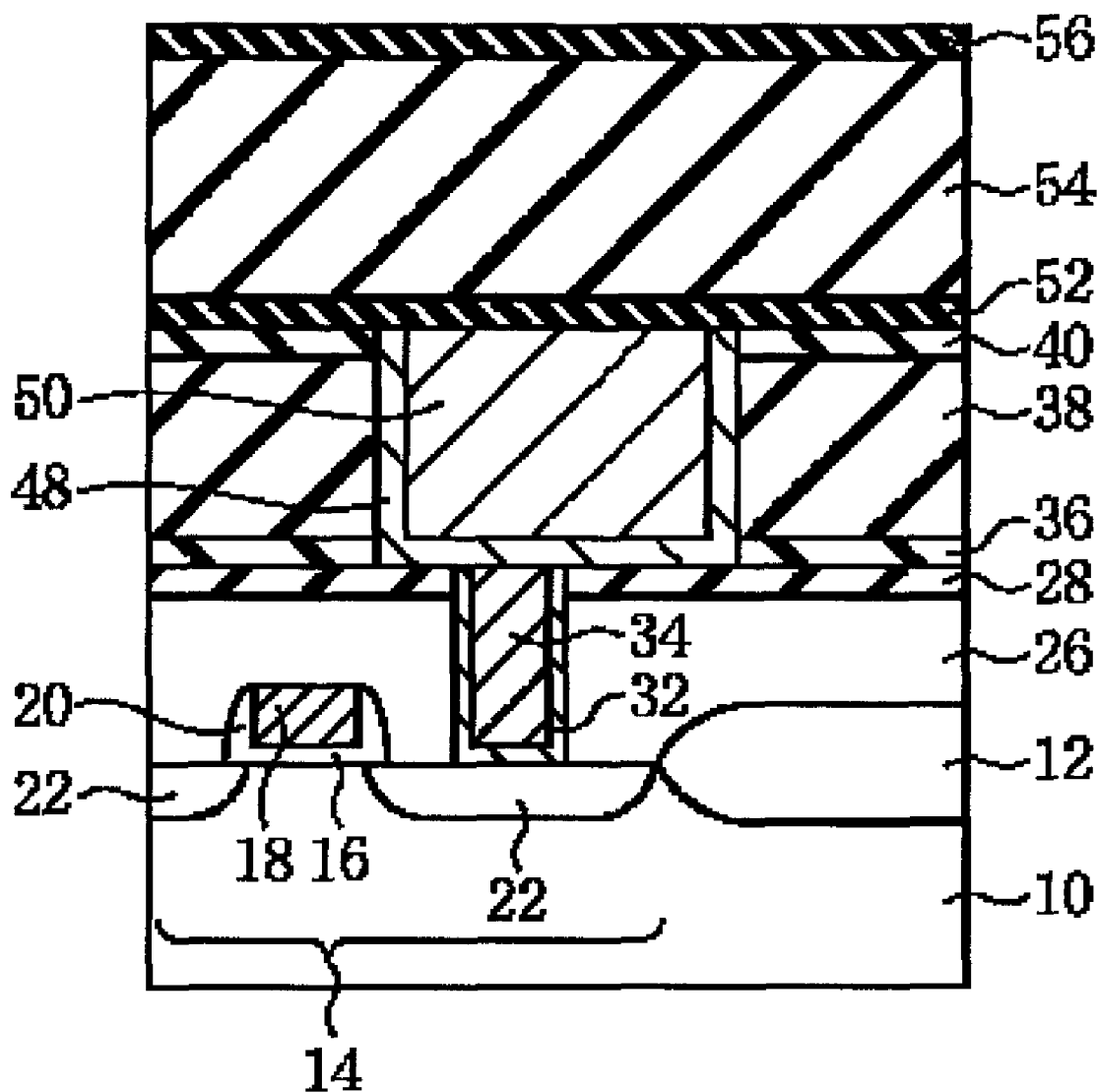
FIG. 4 is a process diagram (eighth) illustrating examples of methods for manufacturing a multilayer interconnection structure and a semiconductor device that have an insulating film formed by using the insulating film material.

A porous silica film 54 with a thickness of 180 nm was then formed in the same manner as the porous silica film 38, as shown in FIG. 4.

Further, an example film 56 with a thickness of 30 nm was then formed in the same manner as the example film 36 over the entire surface of the porous silica film 54.

Figure 5:
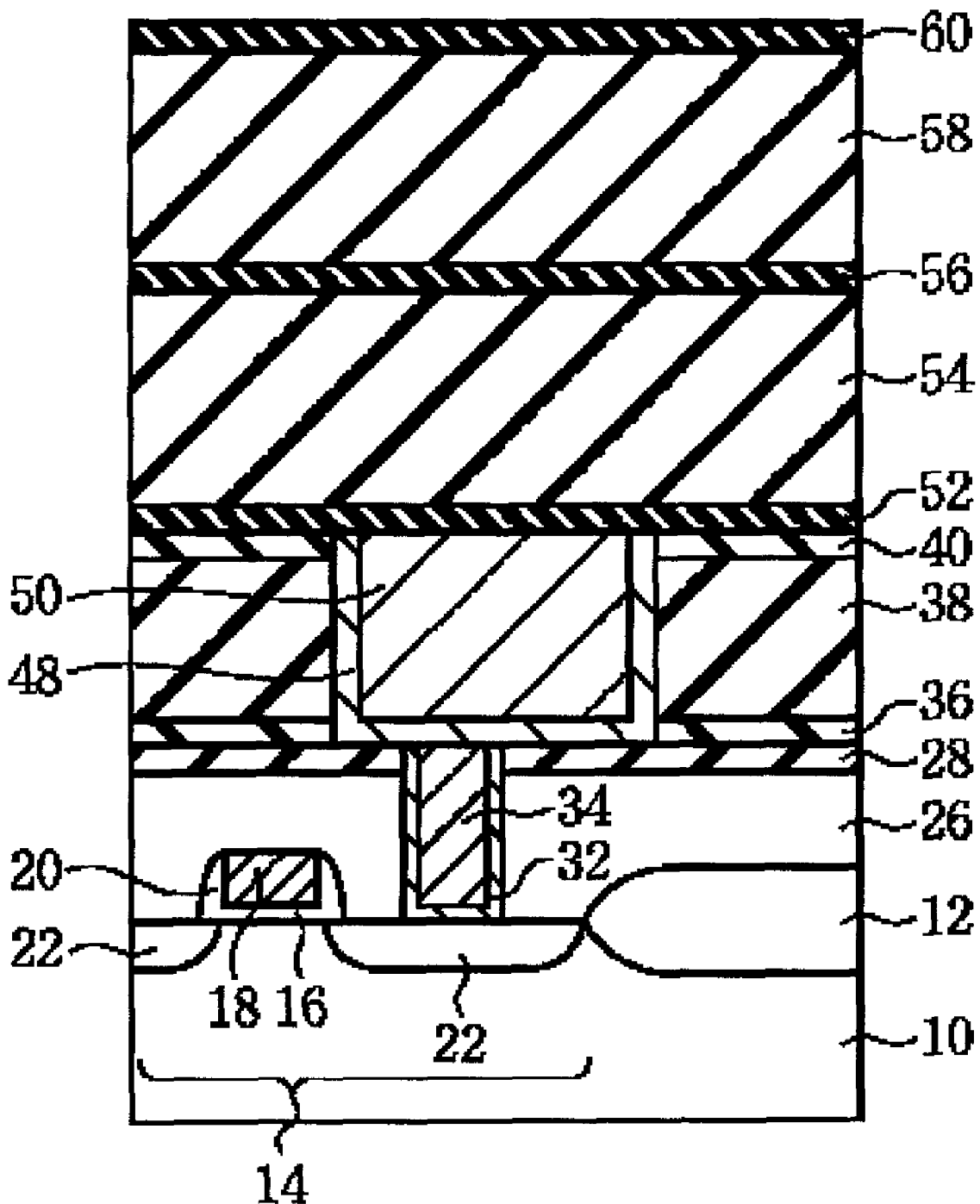
FIG. 5 is a process diagram (ninth) illustrating examples of methods for manufacturing a multilayer interconnection structure and a semiconductor device that have an insulating film formed by using the insulating film material.

Then, a porous silica film 58 with a thickness of 160 nm was formed in the same manner as the porous silica film 38, as shown in FIG. 5. An example film 60 with a thickness of 30 nm was then formed in the same manner as the example film 36 over the entire surface of the porous silica film 58.

Figure 6:
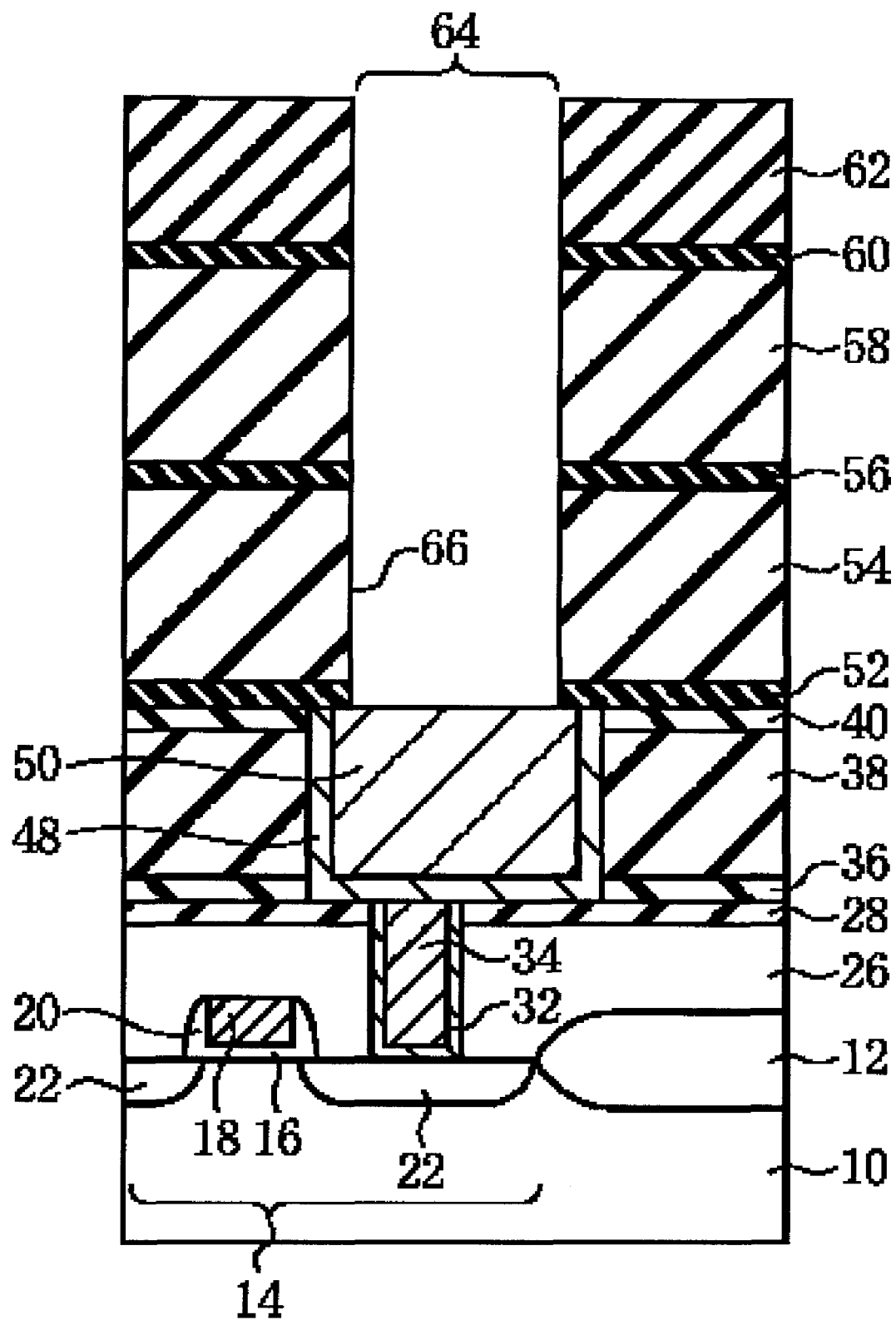
FIG. 6 is a process diagram (tenth) illustrating examples of methods for manufacturing a multilayer interconnection structure and a semiconductor device that have an insulating film formed by using the insulating film material.

Then, as shown in FIG. 6, a photoresist film 62 was formed over the entire surface by spin coating. An opening 64 was then formed in the photoresist film 62 by using a photolithography technique. Here, the opening 64 served to form a contact hole 66 reaching the first-layer interconnection (first metal interconnection layer) 50. The example film 60, porous silica film 58, example film 56, porous silica film 54, and example film 52 were then etched by using the photoresist 62 as the mask. The etching was performed using a fluorine plasma that employed $CF_4$ gas and $CHF_3$ gas as the starting materials, and the composition ratio of the etching gas and pressure during etching were appropriately varied during etching. As a result, the contact hole 66 reaching the interconnection 50 was formed. The photoresist 62 was thereafter peeled off.

Figure 7:
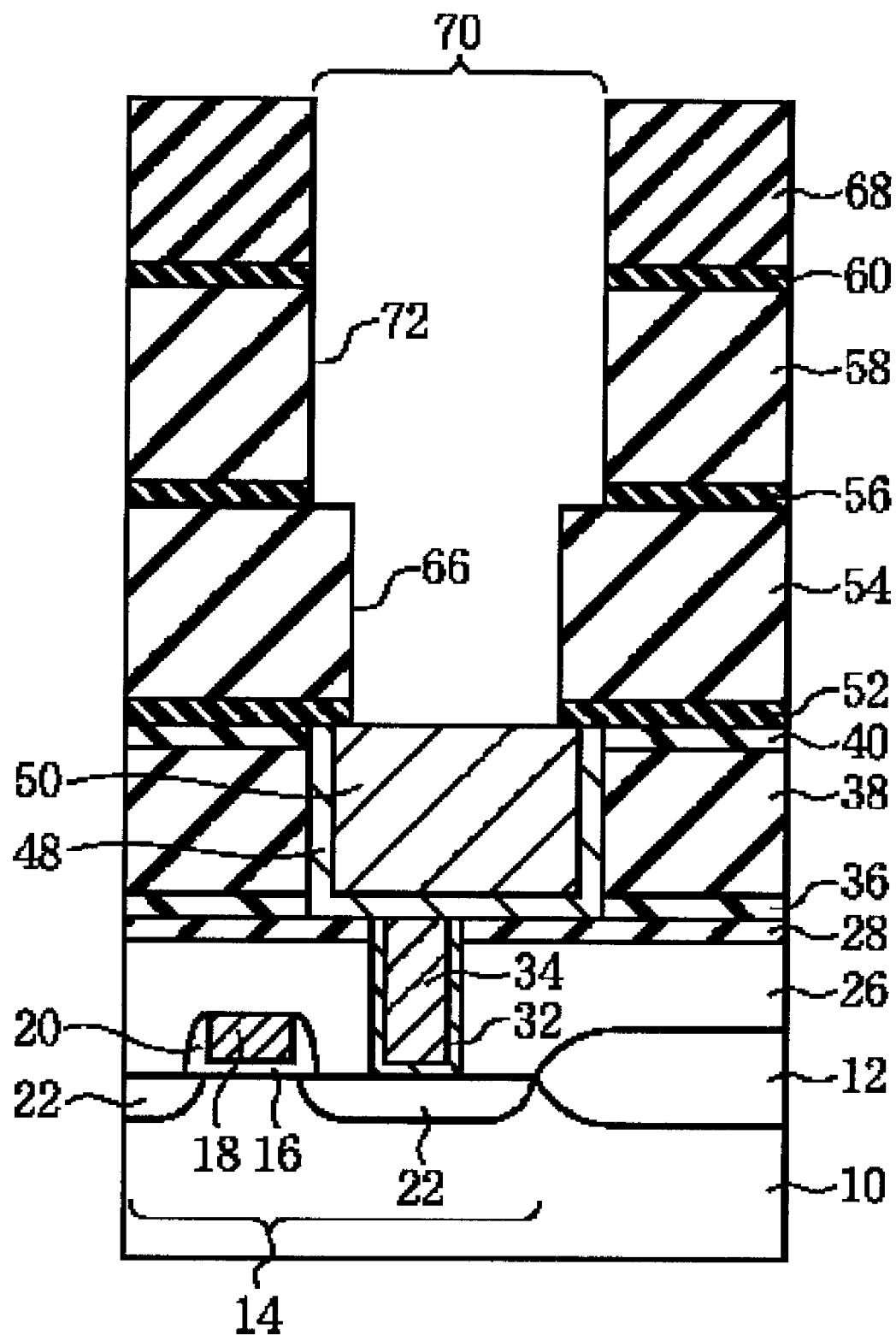
FIG. 7 is a process diagram (eleventh) illustrating examples of methods for manufacturing a multilayer interconnection structure and a semiconductor device that have an insulating film formed by using the insulating film material.
Figure 8:
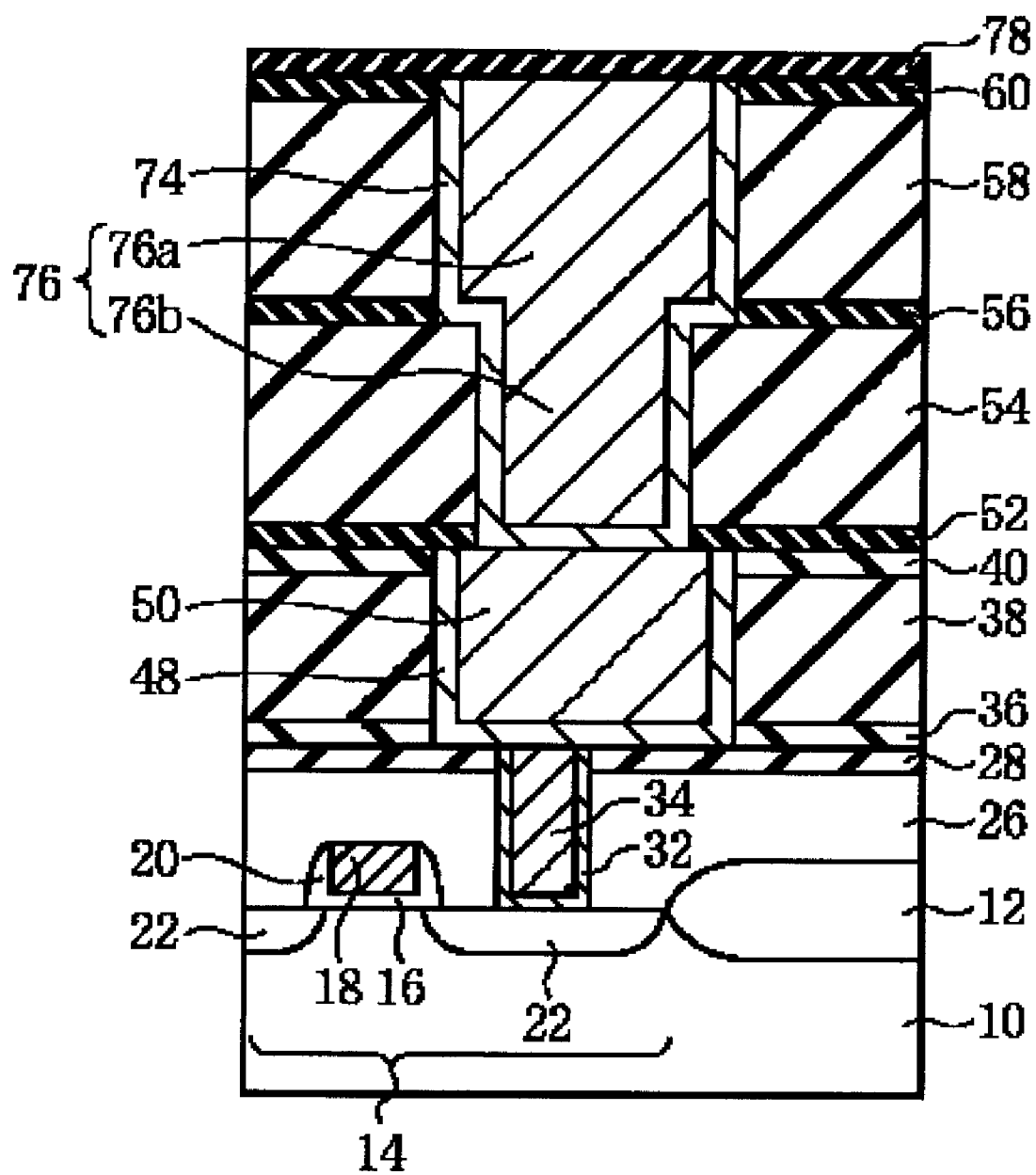
FIG. 8 is a process diagram (twelfth) illustrating examples of methods for manufacturing a multilayer interconnection structure and a semiconductor device that have an insulating film formed by using the insulating film material.

Then, as shown in FIG. 7, a photoresist film 68 was formed over the entire surface by spin coating. An opening 70 was then formed in the photoresist 68 by using a photolithography technique. Here, the opening 70 served to form a second-layer interconnection (second metal interconnection layer) 76a (see FIG. 8).

The example film 60, porous silica film 58, and example film 56 were then etched by using the photoresist film 68 as a mask. The etching was performed using a fluorine plasma that employed $CF_4$ gas and $CHF_3$ gas as the starting materials. At this time, the example film 56 functioned as an etching stopper film. A groove 72 for embedding the interconnection 76a was thus formed in the example film 60, porous silica film 58, and example film 56. The groove 72 was connected to the contact hole 66.

A barrier film (not shown in the figure) composed of TaN and having a thickness of 10 nm was then formed over the entire surface by sputtering. The barrier film had a function of preventing Cu contained in the below-described interconnection 76a and conductor plug 76b from diffusing into the insulating film. A seed film (not shown in the figure) composed of Cu and having a thickness of 10 nm was then formed over the entire surface by sputtering. The seed film functioned as an electrode when the interconnection 76a and conductor plug 76b containing Cu were formed by electroplating. A laminated film 74 composed of the barrier film and seed film was thus formed (see FIG. 8).

A Cu film 76 with a thickness of 1,400 nm was then formed by electroplating.

The Cu film 76 and laminated film 74 were then polished by chemical-mechanical polishing (CMP) till the surface of the example film 60 was exposed. At this time, the example film 60 functioned as a CMP stopper film. As a result, the conductor plug 76b containing Cu was embedded in the contact hole 66, and the interconnection 76a containing Cu was embedded in the groove 72. The conductor plug 76b and interconnection 76a were formed integrally. A manufacturing method in which the conductor plug 76b and interconnection 76a are formed together is called a dual damascene method.

Then, an example film 78 with a thickness of 30 nm was formed in the same manner as the example film 36.

The third-layer interconnection (third metal interconnection layer) that is not shown in the figure was then formed and a semiconductor device was fabricated.

Further, a multilayer interconnection structure and a semiconductor device were fabricated by replacing the $SiO_2$ film produced by CVD with the example film and replacing example film with the porous silica film in the above-described method for fabricating a multilayer interconnection structure and a semiconductor device. In the multilayer interconnection structure and semiconductor device, the example film functions as an interlayer insulating film.

The effective relative permittivity between the interconnections was calculated by the interlayer capacitance for the semiconductor device fabricated in the above-described manner. The results obtained are shown in Table 3.

The effective relative permittivity means a relative permittivity that is measured in a state in which not only the example film and porous silica film, but also other insulating films are present around the interconnection.

Comparative Example 8

Manufacture of Multilayer Interconnection Structure and Semiconductor Device A multilayer interconnection structure and a semiconductor device were manufactured in the same manner as in Example 16, except that the insulating film formed using the insulating film material prepared in any of Comparative Examples 1 to 3 (equivalent to the insulating film of any of Comparative Examples 4 to 6; sometimes referred to hereinbelow as "comparative example film") was replaced with example films 36, 40, 52, 56, 60, and 78.

The effective relative permittivity between the interconnections was calculated by the interlayer capacitance for the semiconductor device fabricated in the above-described manner. The results obtained are shown in Table 3.

TABLE 3

| | Insulating film material | | | | | |
|---|---|---|---|---|---|---|
| | | | | Comp. | Comp. | Comp. |
| Ex. 1 | Ex. 2 | Ex. 3 | Ex. 1 | Ex. 2 | Ex. 3 | |
| | | Insulating film | | | | |
| | | | | Comp. | Comp. | Comp. |
| Ex. 6 | Ex. 7 | Ex. 8 | Ex. 11 | Ex. 4 | Ex. 5 | Ex. 6 |
| Effective relative permittivity (etching stopper film and CMP stopper film) | | | | | | |
| 2.48 | 2.42 | 2.40 | 2.39 | 3.22 | 2.61 | 2.58 |
| Effective relative permittivity (interlayer insulating film) | | | | | | |
| 2.59 | 2.55 | 2.46 | 2.44 | 3.42 | 2.75 | 2.77 |

Table 3 shows that by using the example films (insulating films formed using the insulating film material) as the etching stopper film, CMP stopper film, and interlayer insulating film, it is possible to decrease the effective relative permittivity between the interconnections, reduce the parasitic capacitance, and decrease the interconnection resistance.

The present invention can resolve the problems inherent to related art and provide an insulating film material that can be advantageously used for forming an insulating film having a low dielectric constant and excellent resistance to damage, such as etching resistance and resistance to liquid reagents, a multilayer interconnection structure in which a parasitic capacitance between the interconnections can be reduced, an efficient method for manufacturing the multilayer interconnection structure, and an efficient method for manufacturing a semiconductor device with a high speed and reliability.

The insulating film material can be advantageously used for forming an insulating film having a low dielectric constant and excellent resistance to damage, such as etching resistance and resistance to liquid reagents, for example, an interlayer insulating film, an etching stopper film, and a protective film for chemical-mechanical polishing (CMP stopper film), and this insulating film material is especially suitable for the multilayer interconnection structure.

The multilayer interconnection structure can increase a signal propagation speed and is especially suitable for a semiconductor integrated circuit that requires the increased response speed.

The method for manufacturing a multilayer interconnection structure can be advantageously used for manufacturing the multilayer interconnection structure.

The method for manufacturing a semiconductor device can be advantageously used for manufacturing a variety of semiconductor devices such as flash memories, DRAMs, FRAMs, and MOS transistors and is especially suitable for manufacturing the semiconductor device.

What is claimed is:

1. An insulating film material comprising:
a silicon compound having a steric structure represented by Structural Formula (1) below:

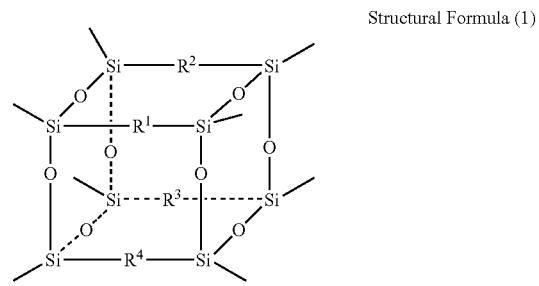

Structural Formula (1)

where, $R^1$, $R^2$, $R^3$, and $R^4$ may be the same or different and at least one of $R^1$, $R^2$, $R^3$, and $R^4$ represents a functional group comprising any of a hydrocarbon and an unsaturated hydrocarbon.

2. The insulating film material according to claim 1, wherein $R^1$, $R^2$, $R^3$, and $R^4$ in the Structural Formula (1) represent at least any of an alkylene group, an alkenylene group, an alkynylene group, a cycloalkylene group, an arylene group, an aralkylene group, a carbonyl group, and a heterocyclic group, which are optionally substituted.

3. The insulating film material according to claim 2, wherein $R^1$, $R^2$, $R^3$, and $R^4$ in the Structural Formula (1) represent at least any of a methylene group, an ethylene group, a propylene group, a butylene group, a phenylene group, an ethyne group, an ethynylene group, and a vinylene group.

4. The insulating film material according to claim 1, wherein a weight-average molecular weight of the silicon compound is 200 to 50,000.

5. The insulating film material according to claim 2, wherein a weight-average molecular weight of the silicon compound is 200 to 50,000.

6. The insulating film material according to claim 3, wherein a weight-average molecular weight of the silicon compound is 200 to 50,000.

7. A multilayer interconnection structure comprising:
an interconnection layer; and
an interlayer insulating film formed using an insulating film material,
wherein the insulating film material comprises a silicon compound having a steric structure represented by Structural Formula (1) below:

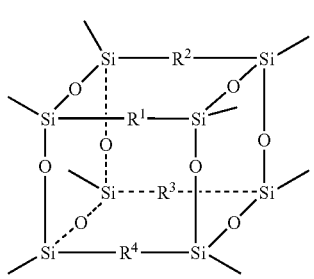

Structural Formula (1)

where, $R^1$, $R^2$, $R^3$, and $R^4$ may be the same or different and at least one of $R^1$, $R^2$, $R^3$, and $R^4$ represents a functional group comprising any of a hydrocarbon and an unsaturated hydrocarbon.

8. The multilayer interconnection structure according to claim 7, wherein a C/O atomic ratio in the interlayer insulating film measured by X ray photoelectron spectroscopy is 0.2 to 5.0.

9. The multilayer interconnection structure according to claim 7, wherein
   the insulating film formed using an insulating film material is contained as an etching stopper film, and wherein
   the insulating film material comprises a silicon compound having a steric structure represented by Structural Formula (1) below:

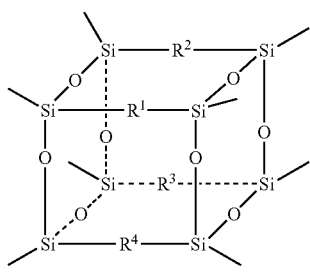

Structural Formula (1)

where, $R^1$, $R^2$, $R^3$, and $R^4$ may be the same or different and at least one of $R^1$, $R^2$, $R^3$, and $R^4$ represents a functional group comprising any of a hydrocarbon and an unsaturated hydrocarbon.

10. The multilayer interconnection structure according to claim 9, wherein a C/O atomic ratio in the etching stopper film measured by X ray photoelectron spectroscopy is 0.2 to 5.0.

11. The multilayer interconnection structure according to claim 7, wherein
   the insulating film formed using an insulating film material is contained as a protective film during chemical-mechanical polishing, and wherein
   the insulating film material comprises a silicon compound having a steric structure represented by Structural Formula (1) below:

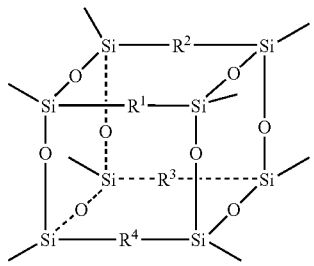

Structural Formula (1)

where, $R^1$, $R^2$, $R^3$, and $R^4$ may be the same or different and at least one of $R^1$, $R^2$, $R^3$, and $R^4$ represents a functional group comprising any of a hydrocarbon and an unsaturated hydrocarbon.

12. The multilayer interconnection structure according to claim 11, wherein a C/O atomic ratio in the protective film measured by X ray photoelectron spectroscopy is 0.2 to 5.0.

13. The multilayer interconnection structure according to claim 7, wherein a porosity in the interlayer insulating film is 10% to 80%, and a thickness thereof is 2 nm to 300 nm.

14. A method for manufacturing a semiconductor device, comprising: forming a multilayer interconnection structure by using a method for manufacturing a multilayer interconnection structure on a surface to be processed, wherein the method for manufacturing a multilayer interconnection structure comprises:
   forming an insulating film by using an insulating film material on a surface to be processed;
   forming an interconnection pattern by etching the insulating film; and
   forming an interconnection by using the interconnection pattern,
   wherein the insulating film material comprises a silicon compound having a steric structure represented by Structural Formula (1) below:

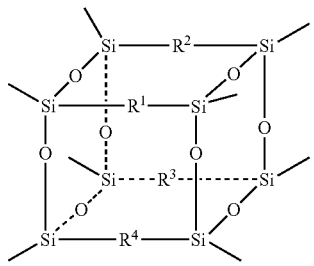

Structural Formula (1)

where, $R^1$, $R^2$, $R^3$, and $R^4$ may be the same or different and at least one of $R^1$, $R^2$, $R^3$, and $R^4$ represents a functional group comprising any of a hydrocarbon and an unsaturated hydrocarbon.

15. The method for manufacturing a semiconductor device according to claim 14, wherein the etching in the step of forming the interconnection pattern is at least one of plasma treatment and reagent coating.

* * * * *